United States Patent [19]
Ishiguro et al.

[11] Patent Number: 4,903,330
[45] Date of Patent: Feb. 20, 1990

[54] HOUSING STRUCTURE FOR PAGING RECEIVER

[75] Inventors: Tetsumi Ishiguro, Tokyo; Kazumori Yamada, Shizuoka, both of Japan

[73] Assignee: NEC Corporation, Japan

[21] Appl. No.: 216,026

[22] Filed: Jul. 7, 1988

[30] Foreign Application Priority Data

Jul. 7, 1987 [JP] Japan .................................. 62-167756

[51] Int. Cl.⁴ .............................................. H04B 11/16
[52] U.S. Cl. ...................................... 455/186; 455/343
[58] Field of Search ..................... 455/89, 90, 186, 343, 455/228, 127, 347–349; 340/311.1, 825.44, 825.46; 361/422

[56] References Cited

U.S. PATENT DOCUMENTS

| | | | |
|---|---|---|---|
| 4,417,246 | 11/1983 | Agnor et al. | 455/343 |
| 4,558,270 | 12/1985 | Liautaud et al. | 455/90 |
| 4,593,409 | 6/1986 | Miller | 455/343 |
| 4,639,726 | 1/1987 | Ichikawa et al. | 455/186 |
| 4,688,262 | 8/1987 | Schaefer et al. | 455/89 |
| 4,709,201 | 11/1987 | Schaefer et al. | 455/90 |
| 4,761,823 | 8/1988 | Fier | 455/90 |
| 4,771,399 | 9/1988 | Snowden et al. | 455/186 |
| 4,786,889 | 11/1988 | Hayasaka | 455/90 |

OTHER PUBLICATIONS

"Electronic Engineers Masters Catalog", Hearst, 1982, p. 2100.

*Primary Examiner*—Robert L. Griffin
*Assistant Examiner*—Curtis A. Kuntz
*Attorney, Agent, or Firm*—Ostrolenk, Faber, Gerb & Soffen

[57] ABSTRACT

Disclosed is a structure of a housing for a paging receiver of the type including a storage device and a write terminal for a writing code in the storage device. A battery case is disposed in a part of the housing and provided with a window that communicates with the interior of the housing. The write terminal electrically connected to the storage device faces the window so that a connector of a writing apparatus may be inserted into the housing through the window to be connected to the write terminal. The write terminal is not exposed to the outside of the housing, thereby to enhance the resistivity to static electricity and hermetic sealing against dust, water and other impurities and therefore to achieve reliable operation.

7 Claims, 4 Drawing Sheets

HOUSING STRUCTURE FOR PAGING RECEIVER

BACKGROUND OF THE INVENTION

The present invention relates to the structure of a housing of a paging receiver and, more particularly, to the housing structure of a paging receiver of the type having a storage device and an exclusive write terminal for writing code in the storage device.

There is an increasing demand for a paging receiver which is miniature, inexpensive, reliable and easy to maintain. Particularly as regards structure, the demand for easy maintenance and high reliability is high. A prior art paging receiver usually includes a chamber for accommodating a printed circuit board on which an electrically-erasable programmable read-only-memory (EEPROM) or like storage device for storing a paging number is loaded. Another chamber adjoins the above-mentioned chamber to receive a battery therein. The EEPROM on the printed circuit board is connected by leads to a write terminal for writing the paging number in the EEPROM. The write terminal is provided on the printed circuit board or mounted on an exterior part of a housing of the receiver to show itself for easy access from the outside.

A drawback with the arrangement wherein the write terminal is mounted on the printed circuit board is that the code cannot be written in the EEPROM without disassembling the housing in which the printed circuit board is accommodated and then connecting a writing apparatus to the write terminal. This not only entails troublesome operation but also runs contrary to the demand for easy maintenance. On the other hand, the write terminal fitted to a part of the housing creates the problem that static electricity is apt to be conducted to the EEPROM and various integrated circuits via the write terminal. Such static electricity would destroy the code stored in the EEPROM, cause the receiver to malfunction, and even destroy the whole circuitry in the receiver, critically lowering the reliability of the receiver.

SUMMARY OF THE INVENTION

It is therefore an object of the present invention to provide a housing structure for a paging receiver that facilitates maintenance, promotes easy writing of code, and has a high reliability of operation.

It is another object of the present invention to provide a generally improved housing structure for a paging receiver.

A housing structure for a paging receiver of the present invention comprises a chamber for accommodating a printed circuit board on which at least a storage device for storing code and a write terminal for writing the code in the storage device are mounted; a battery case provided in a space which adjoins the chamber and having an opening which is exposed to the outside; and a window formed through a part of the battery case that adjoins the chamber and communicates with the chamber. The write terminal is located on the printed circuit board in such a manner as to face the window, such that the write terminal is connectible to a connector of a writing apparatus that is inserted through the window as needed.

BRIEF DESCRIPTION OF THE DRAWINGS

The above and other objects, features and advantages of the present invention will become more apparent from the following detailed description taken with the accompanying drawings, in which.

DESCRIPTION OF THE PREFERRED EMBODIMENTS

Figure 1:
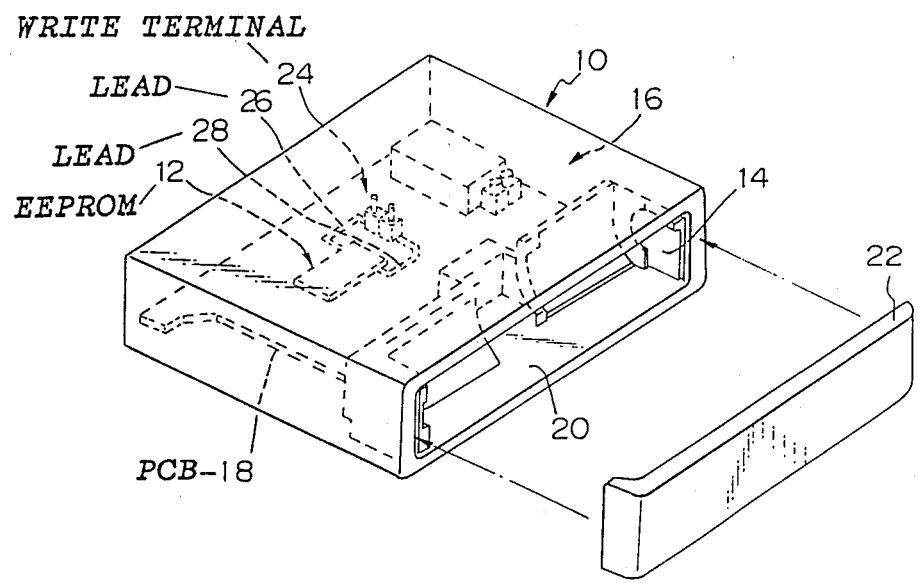
FIGS. 1 and 2 are perspective views each showing a different prior art housing structure for a paging receiver.
Figure 2:
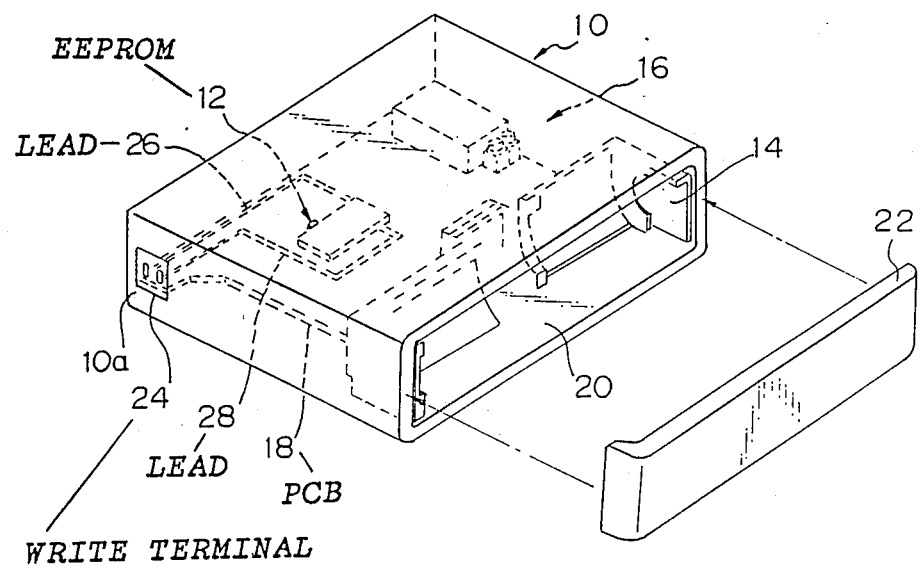

To better understand the present invention, a brief reference will be made to prior art housing structures for a paging receiver which are shown in FIGS. 1 and 2.

Referring to FIG. 1, a prior art housing 10 for a paging receiver accommodates therein an EEPROM or similar storage device 12 for storing desired code which is assigned to the paging receiver. A battery case 14 for receiving a battery therein is built in the housing 10 so that a chamber 16 is defined by the battery case 14 and the housing 10. A printed circuit board (PCB) 18 is disposed in the chamber 16. The battery case 14 has an opening 20 which is usually closed by a lid 22 which forms a part of the housing 10. The EEPROM 12 is mounted on the printed circuit board 18 and connected by leads 26 and 28 to a write terminal 24 so that the code may be written in the EEPROM 12 via the terminal 24. While the write terminal 24 shown in FIG. 1 is directly mounted on the printed circuit board 18, it may be mounted in a part 10a of the housing 10 as shown in FIG. 2.

Each of the prior art housing structures shown and described has a problem left unsolved, as previously stated. Specifically, with the arrangement of FIG. 1, it is necessary to write code in the EEPROM 12 by disassembling the housing 10 in which the printed circuit board 18 is accommodated and then connecting a writing apparatus (not shown) to the write terminal 24. This is not only troublesome but also objectionable from the easy maintenance standpoint. On the other hand, the structure of FIG. 2 suffers from a drawback that static electricity is apt to be conducted to the EEPROM 12 and various integrated circuits via the write terminal 24 which is exposed to the outside through the housing 10a. Such static electricity would destroy the data stored in the EEPROM 12, cause the receiver to malfunction, and even destroy the whole circuitry stored in the receiver, critically lowering the reliability of the receiver.

Referring to FIGS. 3 to 8, there are shown preferred embodiments of the present invention which are free from the drawbacks particular to the prior art housing structures as discussed above. In FIGS. 3 to 8, the same or similar structural elements as those shown in FIGS. 1 and 2 are designated by like reference numerals.

Figure 3:
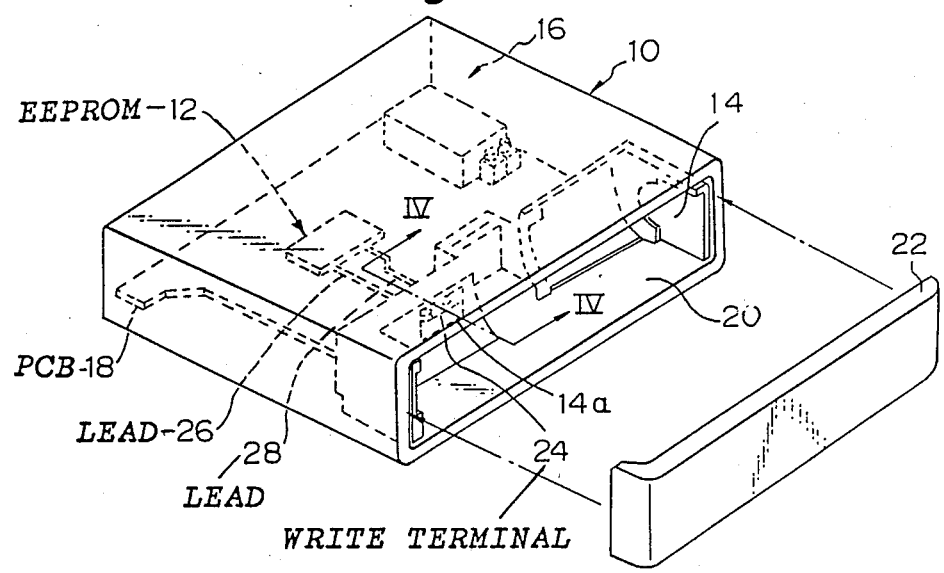
FIG. 3 is a perspective view showing a housing structure embodying the present invention.
Figure 4:
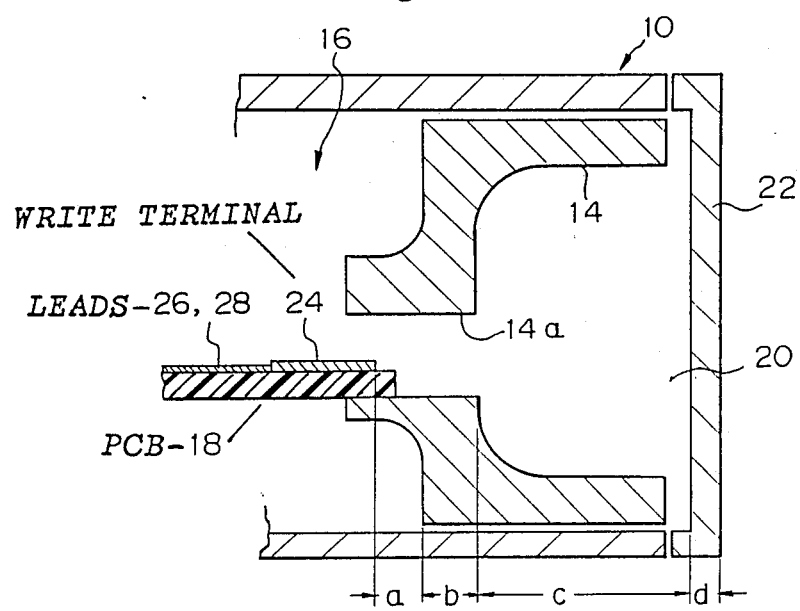
FIG. 4 is a fragmentary section along line IV—IV of FIG. 3.

In FIGS. 3 and 4, a housing 10 in accordance with the present invention is generally configured in a rectangular parallelepiped. A battery case 14 is built in the housing 10 adjacent to an opening 20 of the housing 10 and defines a chamber 16 in cooperation with the housing 10. A lid 22 is removably mounted on the housing 10 to close the opening 20 while forming a part of the housing 10, whereby a chamber for receiving a battery (not shown) is defined. The housing 10, battery case 14 and lid 22 are each made of a non-conductive material such as polycarbonate. A printed circuit board 18 is disposed in the chamber 16 while an EEPROM 12 is mounted on the circuit board 18 together with various kinds of circuit parts. A write terminal 24 is loaded in one end portion of the printed circuit board 18 and electrically connected to the EEPROM 12 by leads 26 and 28. That part of the battery case 14 which faces the write terminal 24 is provided with an opening or window 14a. This window 14a allows a connector 32 of a writing apparatus 30 which will be now described with reference to FIGS. 5 and 6 to be inserted through the window 14a into electrical connection with the write terminal 24.

Figure 5:
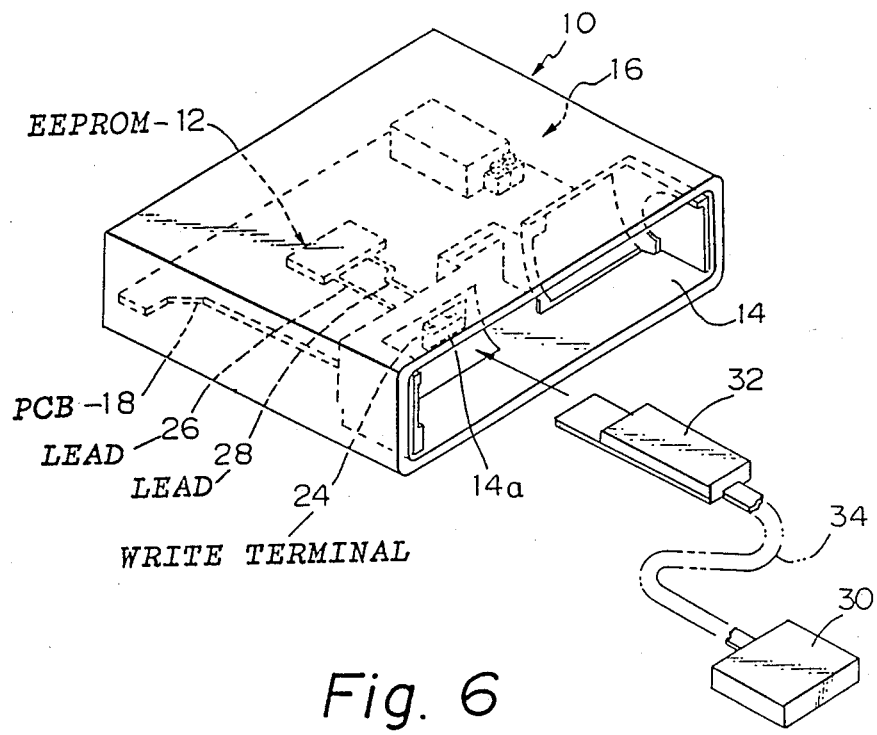
FIG. 5 is a perspective view demonstrating how to write a paging number with the embodiment of FIG. 3.
Figure 6:
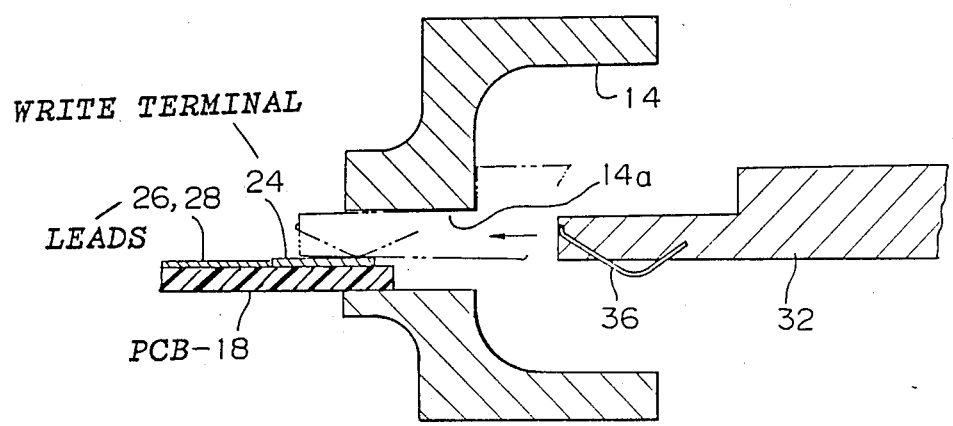
FIG. 6 is a fragmentary section associated with FIG. 5.

FIGS. 5 and 6 show how a desired code is written in the EEPROM 12. Specifically, the lid 22 (FIG. 3) is removed to expose the battery case 14 to the outside, and then the connector 32 connected to the writing apparatus 30 by wiring 34 is inserted into the housing 10 via the window 14a to be connected to the write terminal 24. In this condition, a code may be written in the EEPROM 12 which is connected to the writing apparatus 30 via the write terminal 24 and leads 26 and 28. In FIG. 6, the reference numeral 36 designated a resilient contact for connection.

In this particular embodiment, although the write terminal 24 is entirely accommodated in the housing 10, a code can be written in the EEPROM 12 merely by removing the lid 22 and inserting the connector 32 through the window 14a of the battery case 14 into connection with the write terminal 24. This facilitates writing operation and promotes easy maintenance.

As shown in FIG. 4, assume that the distance between the write terminal 24 and the inner surface of the battery case 14 is a, the thickness of the battery case 14 is b, the inside dimension of the battery case 14 is c, and the thickness of the lid 22 is d. Then, the write terminal 24 which is not exposed to the outside is spaced apart from the outer surface of the battery case 14 by a distance a+b and, when the lid 22 is attached to the housing 10, it is spaced apart from the outer surface of the lid 22 by a distance a+b+c+d. The influence of static electricity developed outside the housing 10 on the interior of the housing 10 is reduced in proportion to the distance a+b or a+b+c+d to protect the EEPROM 12 and other various circuit parts from destruction. Such a structure, therefore, enhances reliable operations of the paging receiver.

Figure 7:
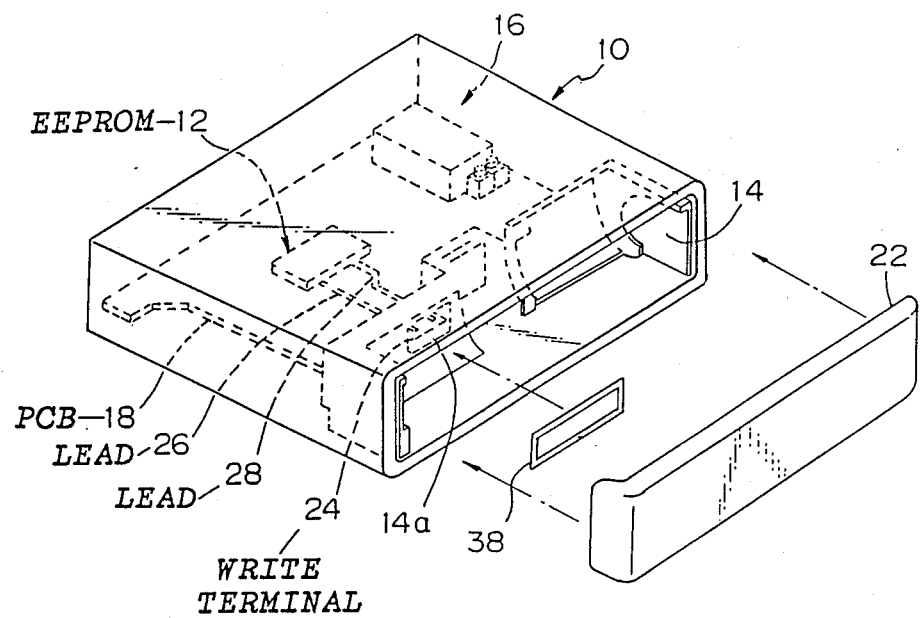
FIG. 7 is a perspective view showing another embodiment of the present invention.
Figure 8:
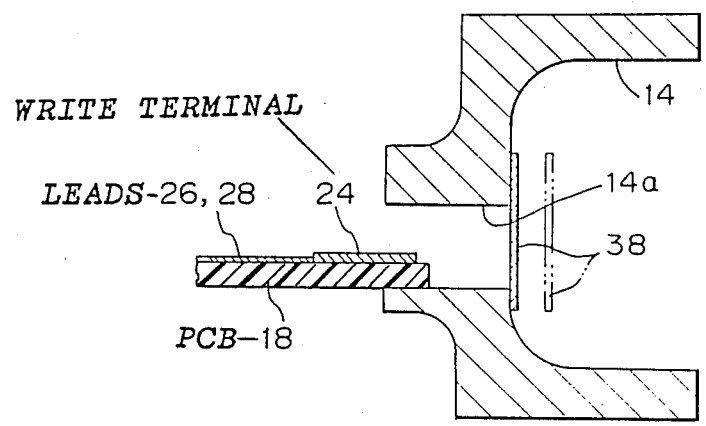
FIG. 8 is a fragmentary section associated with FIG. 7.

Referring to FIGS. 7 and 8, another embodiment of the present invention is shown. This embodiment is essentially similar to the previous embodiment except that a non-conductive label 38 is adhered to the battery case 14 to close the window 14a, the label 38 showing the code which is stored in the EEPROM 12. This alternative embodiment has an advantage that a person can see the label 38 and therefore the content stored in the EEPROM 12 simply by removing the lid 22, not to speak of the various advantages described in relation to the first embodiment. In addition, the label 38 which closes the window 14a further enhances the resistivity of the EEPROM 12 and others to static electricity and prevents dust, water and other impurities from reaching the write terminal 24 and printed circuit board 18 through the window 14a.

In summary, a housing for a paging receiver in accordance with the present invention includes a battery case that forms a part of the housing and communicates with the interior of the housing through a window. A connector of a writing apparatus may be inserted into the housing through the window into connection with a write terminal that is electrically connected to a storage device. Hence, a code can be written in the storage device simply by removing a lid that is adapted to close the battery case. This promotes easy writing operation as well as easy maintenance. Since the write terminal is not exposed to the outside of the housing, resistivity to static electricity and hermetic sealing against impurities are enhanced to offer unprecedented reliability of operation.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A housing structure for a paging receiver comprising:
   a printed-circuit board on which are mounted at least a storage device for storing code and a write terminal for writing the code in the storage device;
   a chamber for accommodating said printed-circuit board;
   a battery chamber that is spaced from the printedcircuit board chamber by an internal separating wall and that has an opening to permit battery insertion and removal from the outside;
   said internal separating wall having a window with an opening in said printed-circuit board chamber in proximity to the portion of said printed-circuit board on which said write terminal is mounted, and with a further opening in said battery chamber for allowing a connector of a writing apparatus to be inserted through the window and into contact with said write terminal.

2. A structure as claimed in claim 1, further comprising a label that closes said window.

3. A structure as claimed in claim 2, wherein said label is adhesive and non-conductive.

4. A structure as claimed in claim 2, wherein said label shows the code that is stored in said storage device.

5. A structure as claimed in claim 1, further comprising a lid for closing said opening of said battery case.

6. A structure as claimed in claim 5, wherein said housing, said battery case and said lid each comprises non-conductive material.

7. A structure as claimed in claim 1, wherein said window is positioned and shaped to receive a portion of said printed-circuit board on which said write terminal is mounted.

* * * * *